US012751084B2

(12) United States Patent
Zhang

(10) Patent No.: US 12,751,084 B2
(45) Date of Patent: Sep. 29, 2026

(54) ARRAY SUBSTRATE AND METHOD FOR MANUFACTURING THE SAME

(71) Applicant: Guangzhou China Star Optoelectronics Semiconductor Display Technology Co., LTd., Guangzhou (CN)

(72) Inventor: Yi Zhang, Guangzhou (CN)

(73) Assignee: GUANGZHOU CHINA STAR OPTOELECTRONICS SEMICONDUCTOR DISPLAY TECHNOLOGY CO., LTD., Guangzhou (CN)

( * ) Notice: Subject to any disclaimer, the term of this patent is extended or adjusted under 35 U.S.C. 154(b) by 354 days.

(21) Appl. No.: 18/542,197

(22) Filed: Dec. 15, 2023

(65) Prior Publication Data

US 2024/0222398 A1 Jul. 4, 2024

(30) Foreign Application Priority Data

Dec. 30, 2022 (CN) ......................... 202211735698.2
Mar. 17, 2023 (CN) ......................... 202310268962.4

(51) Int. Cl.

*H10D 86/40* (2025.01)
*H10D 86/01* (2025.01)
*G02F 1/1362* (2006.01)
*G02F 1/1368* (2006.01)

(52) U.S. Cl.

CPC ..... *H10D 86/021* (2025.01); *G02F 1/136227* (2013.01); *G02F 1/1368* (2013.01)

(58) Field of Classification Search

CPC ....... H10D 86/021; H10D 86/40; H10D 86/60
See application file for complete search history.

(56) References Cited

U.S. PATENT DOCUMENTS 11,163,201 B2 * 11/2021 Kim .................. G02F 1/136227
2017/0084631 A1 * 3/2017 Kim ....................... H10D 86/60

* cited by examiner

*Primary Examiner* — Trang Q Tran
(74) *Attorney, Agent, or Firm* — PV IP PC; Peter Stecher; Wei Te Chung

(57) ABSTRACT

An array substrate includes a substrate, a gate layer, a source-drain layer, a first passivation layer, a common electrode layer, a second passivation layer, a pixel electrode layer, and a via hole penetrating at least the second passivation layer. The via hole has a deep hole region and a shallow hole region. A first part of the via hole in the deep hole region penetrates the second passivation layer and the first passivation layer, and a second part of the via hole in the shallow hole region penetrates the second passivation layer. In the deep hole region, a pixel electrode is connected to a drain, and in the shallow hole region, the common electrode layer is electrically connected to a compensation electrode through a first connection electrode and a second connection electrode.

16 Claims, 4 Drawing Sheets

ARRAY SUBSTRATE AND METHOD FOR MANUFACTURING THE SAME

CROSS-REFERENCE TO RELATED APPLICATIONS

This application claims priority to and the benefits of Chinese Patent Application No. 202211735698.2, filed on Dec. 30, 2022, and Chinese Patent Application No. 202310268962.4, filed on Mar. 17, 2023, the disclosures of which are incorporated herein by reference in their entirety.

TECHNICAL FIELD

The present disclosure relates to display technologies, and in particular, to an array substrate and a method for manufacturing the array substrate.

BACKGROUND

Referring to FIG. 1, in order to realize an HFS (High Transmittance Field Switching) display mode of a liquid crystal display (LCD) with an active layer made of IGZO (indium gallium zinc oxide), an array substrate of the LCD is provided with a common electrode layer 80 of a large area. Thus, the common electrode layer 80 has a large resistance, which is prone to cause uneven signals in the common electrode layer 80 and thus cause a display abnormality. The abnormality is particularly obvious in a display with a high refresh rate and a high resolution.

To address this problem, the following solution is generally adopted: a compensation electrode 202 is additionally provided in a gate layer 20 of the array substrate and accordingly a via hole is additionally provided in a passivation layer between the compensation electrode 202 and the common electrode layer 80, so that the compensation electrode 202 is connected to the common electrode layer 80 through the additional via hole, thereby reducing impedance and voltage drop of the common electrode layer 80. However, with the limitation of the process of forming via holes in the array substrate, addition of the via holes may lead to a decrease in an aperture ratio of the array substrate.

SUMMARY

In view of the above, one or more embodiments of the present disclosure provide an array substrate including:

a substrate;

a gate layer, provided on the substrate, the gate layer including a gate and a compensation electrode;

a source-drain layer, provided on a side of the gate layer away from the substrate, the source-drain layer including a source, a drain, and a first connection electrode;

a first passivation layer, provided on a side of the source-drain layer away from the substrate;

a common electrode layer, provided on a side of the first passivation layer away from the substrate;

a second passivation layer, provided on a side of the common electrode layer away from the substrate;

a pixel electrode layer, provided on a side of the second passivation layer away from the substrate, the pixel electrode layer including a pixel electrode, a second connection electrode;

a via hole, penetrating at least the second passivation layer and having a deep hole region and a shallow hole region;

Where a first part of the via hole in the deep hole region penetrates the second passivation layer and the first passivation layer, and a second part of the via hole in the shallow hole region penetrates the second passivation layer; and in the deep hole region the pixel electrode is connected to the drain, and in the shallow hole region the common electrode layer is electrically connected to the compensation electrode through the first connection electrode and the second connection electrode.

One or more embodiments of the present disclosure further provide a method of manufacturing an array substrate, including:

providing a substrate;

depositing a metal material layer on the substrate;

applying a yellow light process to the metal material layer to obtain a gate layer including a gate and a compensation electrode;

sequentially forming a gate insulation layer, an active layer, and a source-drain layer on the gate layer, the source-drain layer including a source, a drain, and a first connection electrode;

depositing a first inorganic material layer on a side of the source-drain layer away from the substrate;

depositing a first transparent electrode material layer on the first inorganic material layer to obtain a first passivation layer;

applying the yellow light process to the first transparent electrode material layer to obtain a common electrode layer;

depositing a second inorganic material layer on a side of the common electrode layer away from the substrate to obtain a second passivation layer;

etching the first passivation layer and the second passivation layer by using a photomask, to obtain a via hole penetrating at least the second passivation layer, where in a region with no common electrode layer provided, the via hole penetrates the second passivation layer and the first passivation layer to form a deep hole region of the via hole, and in a region where the common electrode layer is provided to block the etching, the via hole penetrates the second passivation layer only to form a shallow hole region of the via hole;

depositing a second transparent electrode material layer on the second passivation layer and an inner surface of the via hole; and applying the yellow light process to the second transparent electrode material layer to obtain a pixel electrode layer including a pixel electrode and a second connection electrode, where in the deep hole region the pixel electrode is connected to the drain, and in the shallow hole region the common electrode layer is electrically connected to the compensation electrode through the first connection electrode and the second connection electrode.

DETAILED DESCRIPTION

Figure 1:
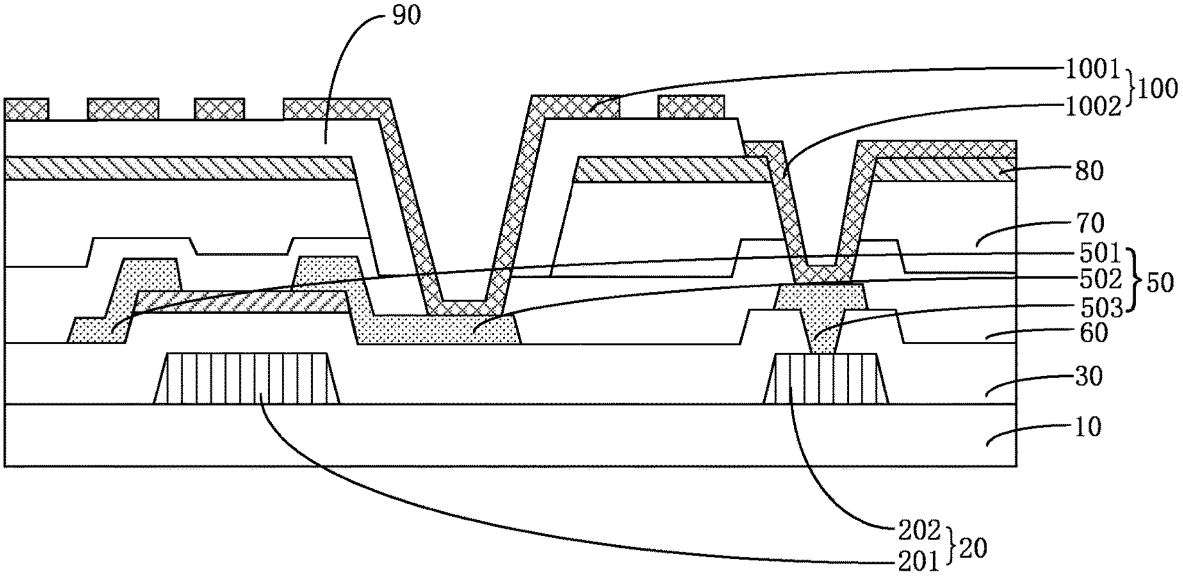
FIG. 1 is a schematic cross-sectional diagram of an array substrate in the related art.

Some embodiments of the present disclosure will be described in detail below in conjunction with the drawings. It should be understood that the described embodiments are only to illustrate and explain the present disclosure, but not intended to limit the present disclosure.

In the present disclosure, unless otherwise stated, locative words used such as "upper" and "lower" generally refer to the upper and lower directions of the device in actual use or working state, and specifically refer to the drawing directions in the drawings; and "inner" and "outer" refer to the outline of the device.

Figure 2:
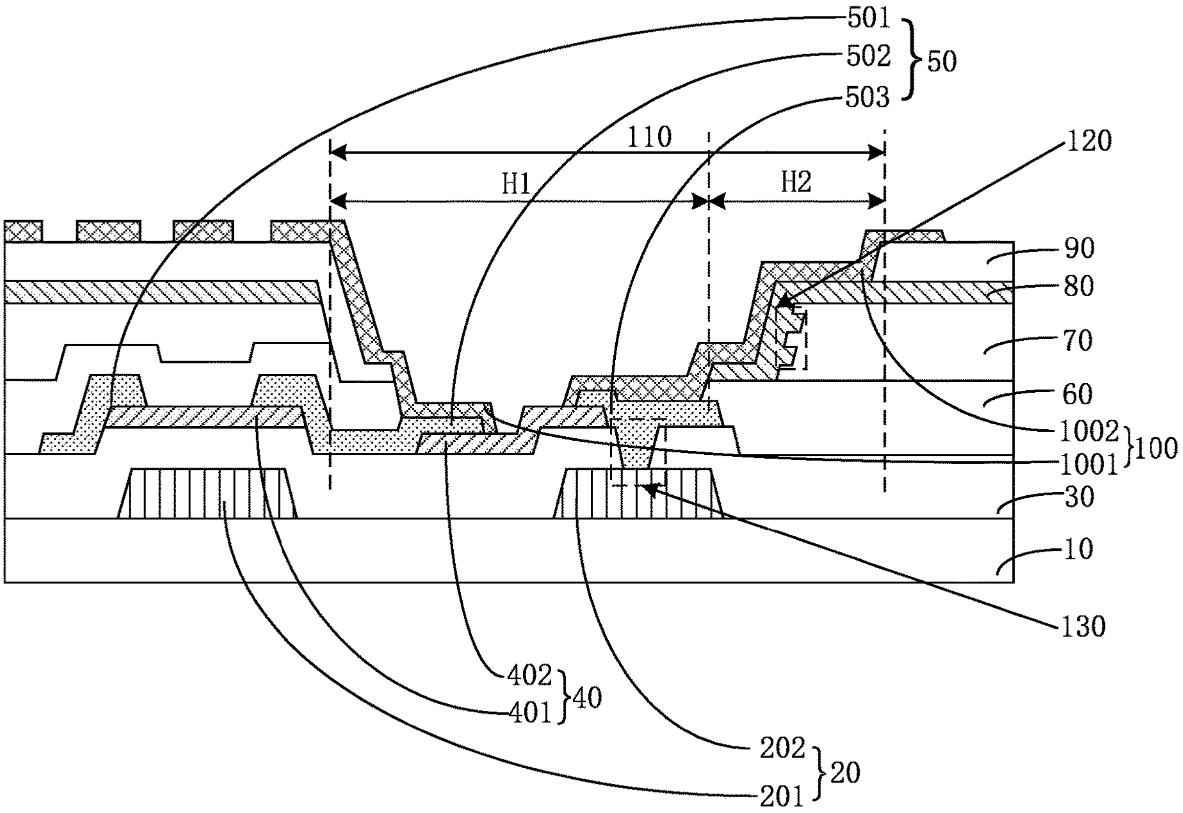
FIG. 2 is a schematic cross-sectional diagram of an example of an array substrate according to one or more embodiments of the present disclosure.

Referring to FIG. 2, one or more embodiments of the present disclosure provide an array substrate including:

- a substrate 10;
- a gate layer 20, provided on the substrate 10, the gate layer 20 including a gate 201 and a compensation electrode 202;
- a source-drain layer 50, provided on a side of the gate layer 20 away from the substrate 10, the source-drain layer 50 including a source 501, a drain 502, and a first connection electrode 503;
- a first passivation layer 60, provided on a side of the source-drain layer 50 away from the substrate 10;
- a common electrode layer 80, provided on a side of the first passivation layer 60 away from the substrate 10;
- a second passivation layer 90, provided on a side of the common electrode layer 80 away from the substrate 10;
- a pixel electrode layer 100, provided on a side of the second passivation layer 90 away from the substrate 10, the pixel electrode layer 100 including a pixel electrode 1001 and a second connection electrode 1002;
- a via hole 110 penetrating at least the second passivation layer 90 and having a deep hole region H1 and a shallow hole region H2; and
- where a first part of the via hole 110 in the deep hole region H1 penetrates the second passivation layer 90 and the first passivation layer 60, and a second part of the via hole 110 in the shallow hole region H2 penetrates the second passivation layer 90; and
- in the deep hole region H1 the pixel electrode 1001 is connected to the drain 502, and in the shallow hole region H2 the common electrode layer 80 is electrically connected to the compensation electrode 202 through the first connection electrode 503 and the second connection electrode 1002.

In addition, an organic layer 70 can be provided on the side of the first passivation layer 60 away from the substrate 10. The organic layer 70 can be a PFA (Polyfluoroalkoxy) organic layer. The common electrode layer 80 can be provided on a side of the organic layer 70 away from the substrate 10. In other words, an organic layer 70 can be disposed between the first passivation layer 60 and the common electrode layer 80. In this case, the via hole 110 penetrates at least the second passivation layer 90 and the organic layer 70, and in the shallow hole region H2 the common electrode layer 80 covers a side wall of the organic layer 70.

According to the present disclosure, connection between the pixel electrode 1001 and the drain 502, and connection between the common electrode layer 80 and the compensation electrode 202 (the gate layer 20) can be achieved via different regions of the via hole 110, thereby reducing the number of the via hole 110 and improving aperture ratio of the array substrate.

It could be understood that the array substrate can include a plurality of via hole 110. Each via hole 110 can have a same structure.

The technical solution of the present disclosure will now be described in connection with specific embodiments.

In the present disclosure, an array substrate with a bottom gate is taken as an example for describing the technical solution. Obviously, for an array substrate with a top gate, and an array substrate with other types gate, the technical solution can be applied as the same.

In some embodiments, a gate insulation layer 30 can be provided on the side of the gate layer 20 away from the substrate 10, and an active layer 40 can be provided on a side of the gate insulation layer 30 away from the substrate 10.

In some embodiments, the active layer 40 is provided on the side of the gate layer 20 away from the substrate 10. The active layer 40 includes an active pattern 401 and a semiconductor pattern 402. The active pattern 401 is connected to the source 501 and the drain 502. The drain 502 is spaced apart from the first connection electrode 503 by a spacing region. The semiconductor pattern 402 is provided at least covering the spacing region.

In one or more embodiments, the active pattern 401 can includes a first doped region connected to the source 501, a second doped region connected to the drain 502, and a third region between the first doped region and the second doped region. Each of the first doped region and the second doped region includes a conductor material, and the third region includes a semiconductor material.

Additionally, the active pattern 401 can include a same material as the semiconductor pattern 402. Specifically, the third region of the active pattern 401 and the semiconductor pattern 402 can be made of same material.

It can be understood that the semiconductor pattern 402 is non-conductive and is capable of blocking the gate insulation layer 30 from being etched, thereby avoiding the gate insulation layer 30 in the spacing region from being defective due to being over-etched during a yellow light process of the first passivation layer 60 and the second passivation layer 90.

It will be appreciated that the semiconductor pattern 402 and the active pattern are formed in a same layer, which can simplify manufacturing process and reduce cost.

In this embodiment, the active layer 40 further includes the semiconductor pattern 402. The semiconductor pattern 402 is insulated from the active pattern 401, and the semiconductor pattern 402 covers at least the spacing region between the drain 502 and the first connection electrode 503. Therefore, the gate insulation layer 30 in the spacing region is prevented from being over-etched.

In one or more embodiments, the array substrate includes a plurality of pixel units and a plurality of the compensation electrodes 202. The pixel units are provided one-to-one with the compensation electrodes 202.

In the related art, an increase of the via holes in the passivation layer leads to a decrease in an aperture ratio of the array substrate due to the limitation of fabrication process of the via holes. Thus, not every pixel unit has one via hole to connect the common electrode layer 80 to the compensation electrode 202, which makes unevenness of signals of the common electrode layer 80 not be well mitigated and the aperture ratio not be further improved. Whereas, in the present disclosure, the connection between the pixel electrode 1001 and the drain 502 and the connection between the common electrode layer 80 and the compensation electrode 202 (the gate layer 20) can be achieved by different regions of the same via hole 110, thereby decreasing the via holes 110 and improving the aperture ratio.

It should be noted that since each pixel unit is provided with one via hole 110, relative to the related art in which a plurality of via holes are provided in each pixel unit, it can reduce an area occupied by via holes and significantly improve the aperture ratio. Since each pixel unit is provided with the compensation electrode 202 to be connected to the common electrode layer 80, the pressure drop of the common electrode layer 80 can be reduced, and homogeneity of common electrode signals can be improved.

In this embodiment, by providing the compensation electrode 202 in each pixel unit, contact impedance of the common electrode layer 80 can be further reduced, which is also conducive for uniformity of the pressure drop of the common electrode layer 80.

In another embodiment, each pixel unit can include a plurality of sub-pixel units, and the compensation electrodes 202 are provided in one-to-one correspondence with the sub-pixel units.

Specifically, each sub-pixel unit can include at least one via hole 110.

In one embodiment, the compensation electrodes 202 can be arranged in an array.

In addition, adjacent compensation electrodes 202 can have same size and shape.

In this embodiment, the array arrangement of the compensation electrodes 202 can facilitate fabrication of the compensation electrodes 202.

In one embodiment, in the shallow hole region H2, the common electrode layer 80 covers an inner wall of the via hole 110.

It can be understood that in the shallow hole region H2, the first passivation layer 60 provided on a side of the common electrode layer 80 toward the substrate 10 has not be etched due to blockage of the common electrode layer 80, and the common electrode layer 80 covers the inner wall of the via hole 110, which can further enhance a contact area between the common electrode layer 80 and the second connection electrode 1002, and thus reduce contact resistance therebetween.

In this embodiment, the common electrode layer 80 of the shallow hole region H2 covers the inner wall of the via hole 110, which enables the second connection electrode 1002 and common electrode layer 80 a larger contact area, thereby reducing the contact resistance.

Further, in one embodiment, a concave-convex structure can be provided within the via hole 110, and the concave-convex structure is at least in surface contact with the common electrode layer 80, thereby increasing bonding force between the common electrode layer 80 and other layers within the via hole 110, thus avoiding occurrence of detachment of the membrane layers from each other.

Furthermore, referring to FIG. 2, the concave-convex structure 120 can be integrally provided with the organic layer 70. The concave-convex structure can be provided on a contact surface between the organic layer 70 and the common electrode layer 80. The contact surface of the organic layer 70 can be the side wall of the organic layer 70 covered by the common electrode layer 80.

Figure 3:
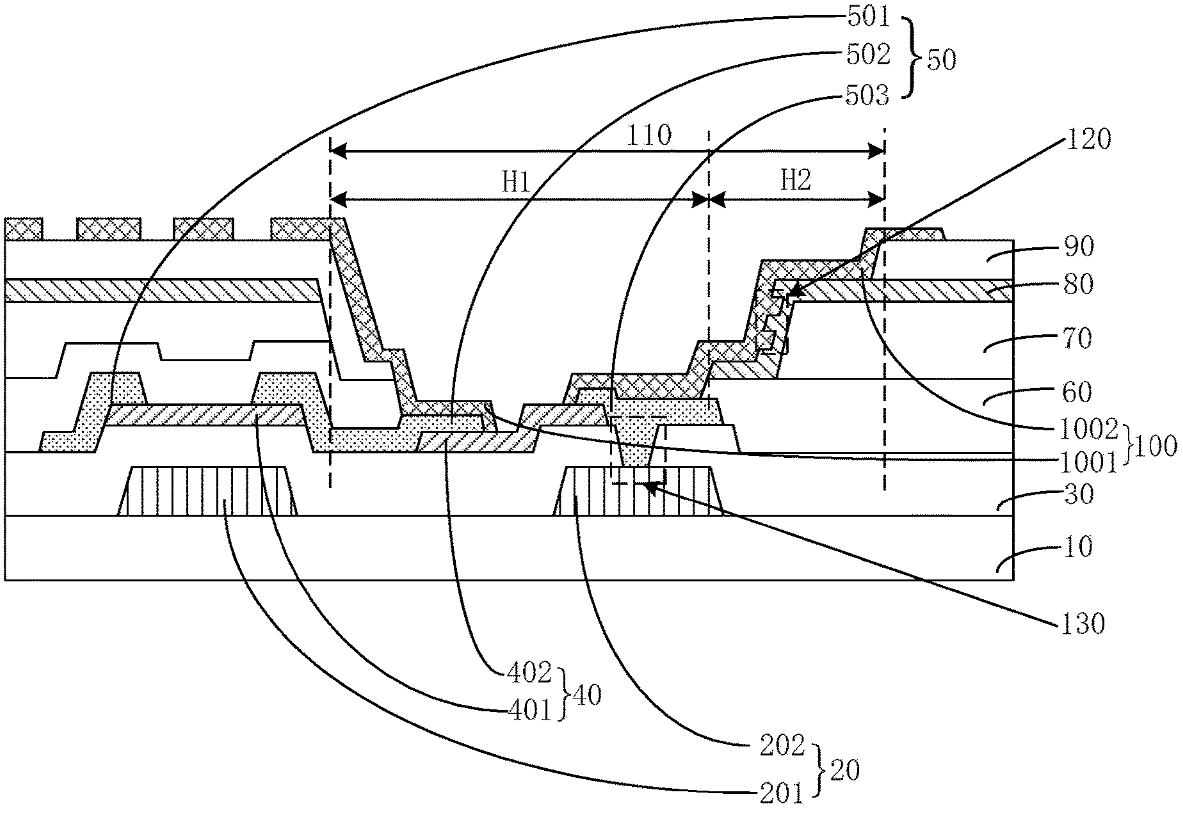
FIG. 3 is a schematic cross-sectional diagram of another example of an array substrate according to one or more embodiments of the present disclosure.

In another embodiment, the second connection electrode 1002 is in surface contact with the common electrode layer 80 to cover at least a part of the common electrode layer covering the aforementioned side wall of the organic layer 70. In addition, referring to FIG. 3, a side surface of the common electrode layer 80 in surface contact with the second connection electrode 1002 can be provided with a concave-convex structure, which roughens the side surface of the common electrode layer 80, thereby increasing a contact area between the common electrode layer 80 and the second connection electrode 1002, thus further reducing the contact resistance between the common electrode layer 80 and the second connection electrode 1002.

In one embodiment, the second connection electrode 1002 is in surface contact with the common electrode layer 80, and the second connection electrode 1002 is provided covering at least the common electrode layer 80 on the inner wall of the via hole 110.

It can be understood that in the shallow hole region H2, the common electrode layer 80 is provided covering the inner wall of the via hole 110. The second connection electrode 1002 is provided covering the common electrode layer 80 along the inner wall of the via hole 110. The second connection electrode 1002 is in surface contact with the common electrode layer 80.

In this embodiment, the second connection electrode 1002 covers the common electrode layer 80 on the inner wall of the via hole 110, which maximizes a contact area between the second connection electrode 1002 and the common electrode layer 80, thereby minimizing contact impedance between the second connection electrode 1002 and the common electrode layer 80.

In one embodiment, the compensation electrode 202 and the common electrode layer 80 are electrically connected in parallel.

In this embodiment, the impedance of the common electrode layer 80 can be reduced by parallel connection between the compensation electrode 202 and the common electrode layer 80.

In another embodiment, resistance of the compensation electrode 202 is less than that of the common electrode layer 80.

In addition, the resistance of the compensation electrode 202 can also be less than that of the first connection electrode 503.

Additionally, the resistance of the compensation electrode 202 can also be less than that of the second connection electrode 1002.

In some embodiments, an end of the second connection electrode 1002 is connected to the common electrode layer 80, the other end of the second connection electrode 1002 is connected to one end of the first connection electrode 503, and the other end of the first connection electrode 503 is connected to the compensation electrode 202.

In one embodiment, the array substrate can further include a gate insulation layer 30, which is provided on a side of the gate layer 20 away from the substrate 10. The active layer 40 is provided on a side of the gate insulation layer 30 away from the substrate 10. In other words, the gate insulation layer 30 is disposed between the gate layer 20 and the active layer 40.

In addition, a connection through hole 130 penetrating the gate insulation layer 30 can be provided. The connection through-hole 130 can be filled with the first connection electrode 503, and the first connection electrode 503 is connected to the compensation electrode 202 through the connection through-hole 130.

It can be understood that opposite ends of the first connection electrode 503 are connected to the second connection electrode 1002 and the compensation electrode 202 respectively, so that the via hole 110 and a connection through-hole 130 penetrating the gate insulation layer 30 can be used to achieve electrical connection between the common electrode layer 80 and the compensation electrode 202. Therefore, the via hole 110 can be formed by multi-digging process and depth of the via hole 110 can be controlled, which avoids defects of single-digging too deep, and alleviates a technical problem that metal wire inside the via hole 110 is prone to wire breakage due to an excessive depth of the via holes 110.

Figure 4:
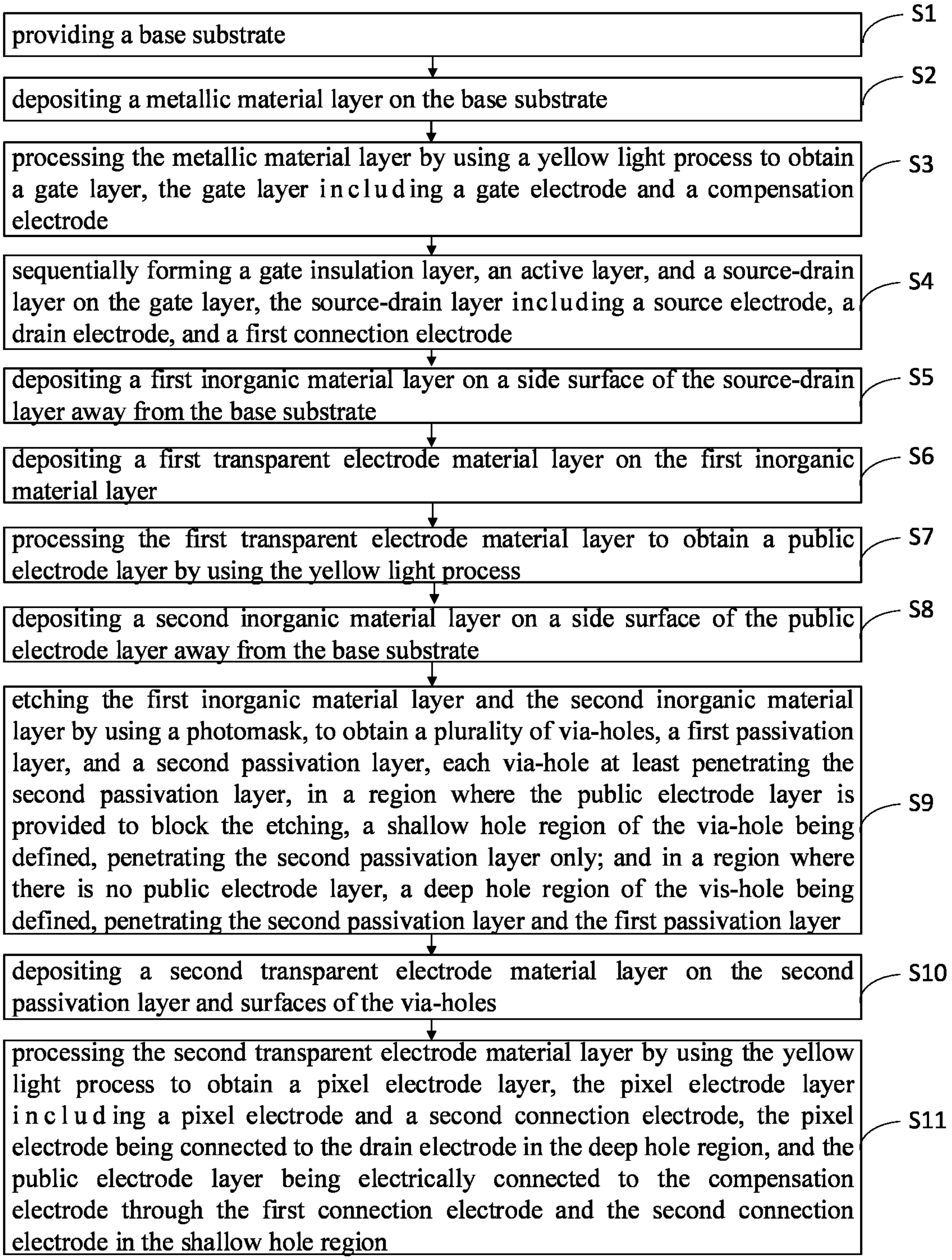
FIG. 4 is a schematic flowchart of a method of manufacturing an array substrate according to one or more embodiments of the present disclosure.

Referring to FIG. 4, in one or more embodiments of the present disclosure, a method of manufacturing an array substrate is provided, which includes the following steps:

At step S1, a substrate 10 is provided;

At step S2, a metal material layer is deposited on the substrate 10;

At step S3, a yellow light process is applied to the metal material layer to obtain a gate layer 20 including a gate 201 and a compensation electrode 202;

At step S4, a gate insulation layer 30, an active layer 40, and a source-drain layer 50 are sequentially formed on the gate layer 20, where the source-drain layer 50 includes a source 501, a drain 502, and a first connection electrode 503;

At step S5, a first inorganic material layer is deposited on a side of the source-drain layer 50 away from the substrate 10;

At step S6, a first transparent electrode material layer is deposited on the first inorganic material layer to obtain a first passivation layer;

At step S7, the yellow light process is applied to the first transparent electrode material layer to obtain a common electrode layer 80;

At step S8, a second inorganic material layer is deposited on a side of the common electrode layer 80 away from the substrate to obtain a second passivation layer;

At step S9, the first inorganic material layer and the second inorganic material layer are etched by using a photomask, to obtain a via hole 110 penetrating at least the second passivation layer 90, where in a region with no common electrode layer 80 provided, the via hole 110 penetrates the second passivation layer 90 and the first passivation layer 60 to form a deep hole region H1 of the via hole 110, and in a region where the common electrode layer 80 is provided to block the etching, the via hole 110 penetrates the second passivation layer 90 only to form a shallow hole region H2 of the via hole 110;

At step S10, a second transparent electrode material layer is deposited on the second passivation layer 90 and an inner surface of the via hole 110;

At step S11, the yellow light process is applied to the second transparent electrode material layer to obtain a pixel electrode layer 100 including a pixel electrode 1001 and a second connection electrode 1002, where in the deep hole region H1 the pixel electrode 1001 is connected to the drain 502, and in the shallow hole region H2 the common electrode layer 80 is electrically connected to the compensation electrode 202 through the first connection electrode 503 and the second connection electrode 1002.

In addition, the drain 502 is spaced apart from the first connection electrode 503 by a spacing region; and the active layer 40 includes an active pattern 401 and a semiconductor pattern 402. The active pattern 401 is connected to the source 501 and the drain 502, and the semiconductor pattern 402 covers at least the spacing region.

In some embodiments, an end of the second connection electrode 1002 is connected to the common electrode layer 80, an other end of the second connection electrode 1002 is connected to an end of the first connection electrode 503, and an other end of the first connection electrode 503 is connected to the compensation electrode 202.

In some embodiments, the gate insulation layer 30 is provided with a connection through hole 130, and the first connection electrode 503 is connected to the compensation electrode 202 through the connection through hole 130.

It can be understood that multiple holes in the related art are combined into one via hole 110 in the present disclosure, so that diameter of the via hole 110 in the present disclosure is bigger than that of one hole is the related art, thereby enabling a larger contact area between the common electrode layer 80 in the via hole 110 and the second connection electrode 1002, thus reducing the contact impedance between the common electrode layer 80 and the second connection electrode 1002.

It should be noted that contact area between the first connection electrode 503 and the second connection electrode 1002 can be also increased in the present disclosure, so that contact impedance between the first connection electrode 503 and the second connection electrode 1002 can be reduced. Either reduction of the contact impedance between the common electrode layer 80 and the second connection electrode 1002 or reduction of the contact impedance between the first connection electrode 503 and the second connection electrode 1002 can reduce contact impedance between the compensation electrode 202 and the common electrode layer 80, thereby further reducing the impedance of the common electrode layer 80.

In this embodiment, at the step S9, the via hole 110 is obtained by using one photomask process. Connection between the pixel electrode 1001 and the drain 502 and connection between the common electrode layer 80 and the compensation electrode 202 of the gate layer 20 can be achieved through a same via hole 110, thereby reducing the via hole 110 and improve the aperture ratio.

In each embodiment of the present disclosure, since connection between the pixel electrode 1001 and the drain 502 and connection between the common electrode layer 80 and the compensation electrode 202 of the gate layer 20 are achieved through the via hole 110, spacing requirement between multiple holes in the related art can be ignored. Thus, it is more space-saving, thus improving the aperture ratio.

Specifically, functions of pixel power supply and connection between the common electrode layer 80 and the compensation electrode 202 are realized simultaneously by combining two or more conventional holes into one via hole 110. An area of one via hole 110 is less than or equal to the sum of areas of two conventional holes. When the area of one via hole 110 is less than the sum of areas of two or more conventional holes, the area occupied by the via hole 110 is reduced and the aperture ratio is improved. And, when the area of the via hole 110 is equal to the sum of the areas of two or more conventional holes, the contact area between the pixel electrode 1001 and the source-drain layer 50, and the contact area between the common electrode layer 80 and the second connection electrode 1002 is larger, which enable power supply resistance of the pixel electrode 1001 and the resistance of the common electrode layer 80 be both lower.

One or more embodiments of the present disclosure further provide a display panel, a display module, and a display device. The display panel, the display module, and the display device all include the above-described array substrate, which will not be repeated herein.

One or more embodiments of the present disclosure provide an array substrate, a method for manufacturing the same, a display panel, a display module, and a display device. The array substrate includes a substrate, a gate layer provided on the substrate, the gate layer including a gate and a compensation electrode, a source-drain layer provided on a side of the gate layer away from the substrate, the source-drain layer including a source, a drain, and a first connection electrode, a first passivation layer provided on a side of the source-drain layer away from the substrate, a common electrode layer, provided on a side of the first passivation layer away from the substrate, a second passivation layer, provided on a side of the common electrode layer away from the substrate, a pixel electrode layer, provided on a side of the second passivation layer away from the substrate, the pixel electrode layer including a pixel electrode and a second connection electrode, where the array substrate further includes a plurality of via holes each penetrating at least the second passivation layer, each via hole includes a deep hole region and a shallow hole region, the deep hole region of the via hole penetrates the second passivation layer and the first passivation layer, and the shallow hole region of the via hole penetrates the second passivation layer, in the deep hole region, the pixel electrode is connected to the drain, and in the shallow hole region, the common electrode layer is electrically connected to the compensation electrode through the first connection electrode and the second connection electrode. In the present disclosure, connection between the pixel electrode and the drain, and connection between the common electrode layer and the compensation electrode of the gate layer can be achieved through different regions of the same via holes, thereby reducing the quantity of the via holes, and improving the aperture ratio.

Some embodiments of the present disclosure are described above, but the scope of the present disclosure is not limited thereto. Any modifications or equivalent substitutions that can readily occur to those skilled in the art based on the present disclosure are intended to fall within the scope of the present disclosure.

What is claimed is:

1. An array substrate, comprising:
- a substrate;
- a gate layer provided on the substrate, the gate layer comprising a gate and a compensation electrode;
- a source-drain layer provided on a side of the gate layer away from the substrate, the source-drain layer comprising a source, a drain, and a first connection electrode;
- a first passivation layer provided on a side of the source-drain layer away from the substrate;
- a common electrode layer provided on a side of the first passivation layer away from the substrate;
- a second passivation layer provided on a side of the common electrode layer away from the substrate;
- a pixel electrode layer provided on a side of the second passivation layer away from the substrate, the pixel electrode layer comprising a pixel electrode and a second connection electrode;
- a via hole penetrating at least the second passivation layer and having a deep hole region and a shallow hole region; and
- wherein a first part of the via hole in the deep hole region penetrates the second passivation layer and the first passivation layer, and a second part of the via hole in the shallow hole region penetrates the second passivation layer; and
- in the deep hole region the pixel electrode is connected to the drain, and in the shallow hole region the common electrode layer is electrically connected to the compensation electrode through the first connection electrode and the second connection electrode.

2. The array substrate according to claim 1, wherein the drain is spaced apart from the first connection electrode by a spacing region; and
- the array substrate further comprises an active layer provided on the side of the gate layer away from the substrate, the active layer comprises an active pattern and a semiconductor pattern, the active pattern is connected to the source and the drain, the semiconductor pattern covers at least the spacing region.

3. The array substrate according to claim 2, wherein the active pattern comprises a first doped region connected to the source, and a second doped region connected to the drain.

4. The array substrate according to claim 3, wherein the active pattern further comprises a third region between the first doped region and the second doped region.

5. The array substrate according to claim 4, wherein each of the first doped region and the second doped region comprises a conductor material, and the third region comprises a semiconductor material.

6. The array substrate according to claim 2, wherein the active pattern comprises a same material as the semiconductor pattern.

7. The array substrate according to claim 1, wherein in the shallow hole region the common electrode layer covers an inner wall of the second part of the via hole.

8. The array substrate according to claim 7, wherein the inner wall is provided with a concave-convex structure in surface contact with at least the common electrode layer.

9. The array substrate according to claim 7, wherein the second connection electrode is in surface contact with the common electrode layer to cover at least a part of the common electrode layer covering the inner wall.

10. The array substrate according to claim 1, wherein the compensation electrode and the common electrode layer are electrically connected in parallel.

11. The array substrate according to claim 1, wherein an end of the second connection electrode is connected to the common electrode layer, an other end of the second connection electrode is connected to an end of the first connection electrode, and an other end of the first connection electrode is connected to the compensation electrode.

12. The array substrate according to claim 11, further comprising a gate insulation layer and an active layer,
- wherein the gate insulation layer is provided on the side of the gate layer away from the substrate, and the active layer is provided on a side of the gate insulation layer away from the substrate; and
- the gate insulation layer is provided with a connection through hole, and the first connection electrode is connected to the compensation electrode through the connection through hole.

13. The array substrate according to claim 1, further comprising an organic layer disposed between the first passivation layer and the common electrode layer,
- wherein the via hole penetrates at least the second passivation layer and the organic layer, and in the shallow hole region the common electrode layer covers a side wall of the organic layer.

14. The array substrate according to claim 13, wherein the side wall is provided with a concave-convex structure in surface contact with the common electrode layer.

15. The array substrate according to claim 13, wherein the second connection electrode is in surface contact with the common electrode layer to cover at least a part of the common electrode layer covering the side wall.

16. The array substrate according to claim 15, wherein the part of the common electrode layer covering the side wall has a surface contacting the second connection electrode and provided with a concave-convex structure.

* * * * *